United States Patent
Barabash et al.

(10) Patent No.: US 9,224,799 B2
(45) Date of Patent: Dec. 29, 2015

(54) CAPACITORS INCLUDING INNER AND OUTER ELECTRODES

(71) Applicant: Intermolecular, Inc., San Jose, CA (US)

(72) Inventors: Sergey Barabash, San Jose, CA (US); Dipankar Pramanik, Saratoga, CA (US)

(73) Assignee: Intermolecular, Inc., San Jose, CA (US)

( * ) Notice: Subject to any disclaimer, the term of this patent is extended or adjusted under 35 U.S.C. 154(b) by 128 days.

(21) Appl. No.: 14/145,117

(22) Filed: Dec. 31, 2013

(65) Prior Publication Data
US 2015/0187865 A1    Jul. 2, 2015

(51) Int. Cl.
*H01L 49/02* (2006.01)
*H01L 27/08* (2006.01)
*H01L 29/66* (2006.01)
*H01L 29/94* (2006.01)
*H01L 27/108* (2006.01)

(52) U.S. Cl.
CPC .......... *H01L 28/75* (2013.01); *H01L 29/66181* (2013.01); *H01L 29/94* (2013.01); *H01L 27/1085* (2013.01)

(58) Field of Classification Search
CPC ....................................................... H01L 28/75
See application file for complete search history.

(56) References Cited

U.S. PATENT DOCUMENTS

| 4,290,186 | A | 9/1981 | Klein et al. |
|---|---|---|---|
| 2002/0028571 | A1* | 3/2002 | Cheung .................... 438/609 |
| 2010/0078758 | A1* | 4/2010 | Sekar et al. .................... 257/530 |
| 2010/0123582 | A1* | 5/2010 | Smith et al. ................. 340/572.3 |
| 2012/0061800 | A1* | 3/2012 | Hirota ............................. 257/532 |
| 2012/0322221 | A1* | 12/2012 | Chen et al. ..................... 438/381 |
| 2013/0071988 | A1* | 3/2013 | Deweerd et al. .............. 438/396 |
| 2014/0187015 | A1* | 7/2014 | Rui et al. ....................... 438/381 |
| 2014/0187016 | A1* | 7/2014 | Malhotra et al. .............. 438/381 |
| 2014/0187018 | A1* | 7/2014 | Malhotra et al. .............. 438/396 |

OTHER PUBLICATIONS

Yamada et al.; Heavily Carbon Doped p-Type GaAs and GaAlAs Grown by Metalorganic Molecular Beam Epitaxy; 1989; Journal of Crystal Growth; Elsevier Science Publishers B.V.; pp. 145-149.

\* cited by examiner

*Primary Examiner* — Lex Malsawma

(57) ABSTRACT

Provided are capacitor stacks for use in integrated circuits and methods of fabricating these stacks. A capacitor stack includes a dielectric layer and one or two inner electrode layers, such as a positive inner electrode layer and a negative inner electrode layer. The inner electrode layers directly interface the dielectric layer. The stack may also include outer electrode layers. The inner electrode layers are either chemically stable or weakly chemically unstable, while in contact with the dielectric layer based on the respective phase diagrams. Furthermore, the electron affinity of the positive inner electrode layer may be less than the electron affinity of the dielectric layer. The sum of the electron affinity and bandgap of the negative inner electrode layer may be less than that of the dielectric layer. In some embodiments, inner electrode layers are formed from heavily doped semiconducting materials, such as gallium arsenide or gallium aluminum arsenide.

10 Claims, 6 Drawing Sheets

CAPACITORS INCLUDING INNER AND OUTER ELECTRODES

BACKGROUND

Dynamic Random Access Memory utilizes capacitors to store bits of information within an integrated circuit. Capacitors are also commonly used in other electronic devices.

A capacitor is formed by placing a dielectric material between two electrodes formed from conductive materials. A capacitor's ability to hold electrical charge (i.e., capacitance) is a function of the surface area of the capacitor plates A, the distance between the capacitor plates d (i.e. the physical thickness of the dielectric layer), and the relative dielectric constant or k-value of the dielectric material. The capacitance is given by:

$$C = k\varepsilon_o \frac{A}{d} \qquad \text{(Eqn. 1)}$$

where $\varepsilon_0$ represents the vacuum permittivity.

The dielectric constant is a measure of a material's polarizability. Therefore, the higher the dielectric constant of a material, the more charge the capacitor can hold. Therefore, if the k-value of the dielectric is increased, the area of the capacitor can be decreased and maintain the desired cell capacitance. Reducing the size of capacitors within the device is important for the miniaturization of integrated circuits. This allows the packing of millions (mega-bit (Mb)) or billions (giga-bit (Gb)) of memory cells into a single semiconductor device. The goal is to maintain a large cell capacitance (generally ~10 to 25 fF) and a low leakage current (generally $<10^{-7}$ A cm$^{-2}$). The physical thickness of the dielectric layers in dynamic random-access memory (DRAM) capacitors could not be reduced unlimitedly in order to avoid leakage current caused by tunneling mechanisms which exponentially increases as the thickness of the dielectric layer decreases.

Traditionally, $SiO_2$ has been used as the dielectric material and semiconducting materials (semiconductor-insulator-semiconductor [SIS] cell designs) have been used as the electrodes. The cell capacitance was maintained by increasing the area of the capacitor using very complex capacitor morphologies while also decreasing the thickness of the $SiO_2$ dielectric layer. Increases of the leakage current above the desired specifications have demanded the development of new capacitor geometries, new electrode materials, and new dielectric materials. Cell designs have migrated to metal-insulator-semiconductor (MIS) and now to metal-insulator-metal (MIM) cell designs for higher performance.

One class of high-k dielectric materials possessing the characteristics required for implementation in advanced DRAM capacitors are high-k metal oxide materials. Examples of suitable dielectric materials comprise $SiO_2$, a bilayer of $SiO_2$, and $Si_xN_y$, SiON, $Al_2O_3$, $HfO_2$, $HfSiO_x$, $ZrO_2$, $Ta_2O_5$, $TiO_2$, $Nb_2O_5$, $SrTiO_3$ (STO), $BaSrTiO_x$ (BST), $PbZrTiO_x$ (PZT), etc. $TiO_2$ and $ZrO_2$ are two specific examples of metal oxide dielectric materials which display significant promise in terms of serving as a high-k dielectric material for implementation in DRAM capacitors.

Typically, DRAM devices at technology nodes of 80 nm and below use MIM capacitors wherein the electrode materials are metals. These electrode materials generally have higher conductivities than the semiconductor electrode materials, higher work functions, exhibit improved stability over the semiconductor electrode materials, and exhibit reduced depletion effects. The electrode materials must have high conductivity to ensure fast device speeds. Representative examples of electrode materials for MIM capacitors are metals, conductive metal oxides, conductive metal silicides, conductive metal nitrides (i.e. TiN), or combinations thereof. MIM capacitors in these DRAM applications utilize insulating materials having a dielectric constant, or k-value, significantly higher than that of $SiO_2$ (k=3.9). For DRAM capacitors, the goal is to utilize dielectric materials with k values greater than about 40. Such materials are generally classified as high-k materials. Representative examples of high-k materials for MIM capacitors are non-conducting metal oxides, non-conducting metal nitrides, non-conducting metal silicates or combinations thereof. These dielectrics may also include additional dopant materials.

A figure of merit in DRAM technology is the electrical performance of the dielectric material as compared to SiO2 known as the Equivalent Oxide Thickness (EOT). A high-k material's EOT is calculated using a normalized measure of silicon dioxide ($SiO_2$ k=3.9) as a reference, given by:

$$EOT = \frac{3.9}{k}D \qquad \text{(Eqn. 2)}$$

where d represents the physical thickness of the capacitor dielectric.

As DRAM technologies scale below the 40 nm technology node manufacturers must reduce the EOT of the high-k dielectric films in MIM capacitors in order to increase charge storage capacity. The goal is to utilize dielectric materials that exhibit an EOT of less than about 0.8 nm while maintaining a physical thickness of about 5-20 nm.

Generally, as the dielectric constant of a material increases, the band gap of the material decreases. For example, the rutile phase of $TiO_2$ has a k-value of about 80 and a band gap of about 3.0 eV while $ZrO_2$ in the tetragonal phase has a k-value of about 43 and a band gap of about 5.8 eV. The low band gap may lead to high leakage current in the device. As a result, without the utilization of countervailing measures, capacitor stacks implementing high-k dielectric materials may experience large leakage currents. High work function electrodes (e.g., electrodes having a work function of greater than 5.0 eV) may be utilized in order to counter the effects of implementing a reduced band gap high-k dielectric layer within the DRAM capacitor. Metals, such as platinum, gold, ruthenium, and ruthenium oxide are examples of high work function electrode materials suitable for inhibiting device leakage in a DRAM capacitor having a high-k dielectric layer. The noble metal systems, however, are prohibitively expensive when employed in a mass production context. Moreover, electrodes fabricated from noble metals often suffer from poor manufacturing qualities, such as surface roughness, poor adhesion, and form a contamination risk in the fab.

Leakage current in capacitor dielectric materials can be due to Schottky emission, Frenkel-Poole defects (e.g. oxygen vacancies ($V_{ox}$) or grain boundaries), or tunneling which may include direct tunneling, Fowler-Nordheim tunneling, or both. Schottky emission, also called thermionic emission, is a common mechanism and is the thermally activated flow of charge over an energy barrier whereby the effective barrier height of a MIM capacitor controls leakage current. The nominal barrier height is a function of the difference between the work function of the electrode and the electron affinity of the dielectric. The electron affinity of a dielectric is closely related to the conduction band offset of the dielectric. The Schottky emission behavior of a dielectric layer is generally determined by the properties of the dielectric/electrode interface. Frenkel-Poole emission allows the conduction of charges through a dielectric layer through the interaction with defect sites such as vacancies, grain boundaries, and the like. As such, the Frenkel-Poole emission behavior of a dielectric layer is generally determined by the dielectric layer's bulk properties. "Direct tunneling" as used herein refers to electrons tunneling directly through the forbidden energy barrier of a dielectric layer. If the dielectric is very thin, the electrons may tunnel through the entire thickness of the layer. "Fowler-Nordheim tunneling" as used herein refers to electrons tunneling initially from the inversion layer of a conductor or semiconductor to the dielectric's conduction band, and then across the barrier. Without being restricted to any particular theory, Fowler-Nordheim tunneling may allow conduction of charges through a dielectric layer without any intermediary interaction (e.g., with defects in the dielectric). Fowler-Nordheim tunneling becomes a significant effect as dielectric thickness and the strength of the imposed electric field are increased. Leakage due to tunneling has been a primary motivation for the substitution of high-k dielectric materials where low-k dielectrics (e.g., $SiO_2$) were previously used. The use of high-k materials allows the use of a physically thicker dielectric layer (i.e., too thick for tunneling) while maintaining the required capacitance (see Eqn 1 above).

The mechanisms for charge transport discussed above suggest that there are several parameters that influence the leakage current across the metal-dielectric interface. Examples of the parameters include physical thickness of the dielectric material, the band gap of the dielectric material, the work function of the metal, the Schottky barrier height (SBH) between the metal and the dielectric material, etc. The SBH has been found to be influenced by many variables such as the composition of the metal and the dielectric, doping levels, defect densities, processing conditions, etc. However, as discussed in the review article by Tung (Materials and Science Engineering, R 35, (2001), pgs. 1-138) which is herein incorporated by reference, in an ideal case, the SBH, $\Phi^0_{B,n}$, is the difference between the work function, $\phi_m$, of the metal and the electron affinity, $X_s$, of the dielectric as illustrated in Eqn. 3 based on the Schottky-Mott theory.

$$\Phi_{B,n}^0 = \phi_m - X_s \quad \text{(Eqn. 3)}$$

Eqn. 3 implies that the variation of the SBH with respect to the work function, $S_{101}$, of the metal should be 1 for a given dielectric material as illustrated in Eqn. 4. This quantity, $S_\Phi$, is defined as the interface behavior parameter or simply the S-parameter. Experimentally, this has been found to be less than 1, indicating that there are additional factors that influence the SBH.

As discussed previously, one of the methods for reducing the leakage current in capacitors is to use metal electrode materials with a high work function. However, if the S-parameter of the dielectric is close to 0, then the use of metal electrode materials with a high work function will not improve the leakage current.

SUMMARY

Provided are capacitor stacks for use in integrated circuits and methods of fabricating these stacks. A capacitor stack includes a dielectric layer and one or two inner electrode layers, such as a positive inner electrode layer and a negative inner electrode layer. The inner electrode layers directly interface the dielectric layer. The stack may also include outer electrode layers. The inner electrode layers are either chemically stable or weakly chemically unstable, such as having an instability energy of less than 10 meV/atom, while in contact with the dielectric layer based on the respective phase diagrams. In some embodiments, inner electrode layers are formed from heavily doped semiconducting materials, such as gallium arsenide, gallium aluminum arsenide, or zinc oxide. In some embodiments, inner electrodes may include other materials that have a substantially zero electronic density of states within less than 1 eV from the Fermi level. Furthermore, the electron affinity of the positive inner electrode layer may be less than the electron affinity of the dielectric layer. The sum of the electron affinity and bandgap of the negative inner electrode layer may be less than that of the dielectric layer.

In some embodiments, a capacitor includes a first layer operable as a negative inner electrode and a second layer operable as a dielectric layer. The first layer directly interfaces the second layer. Furthermore, the material of the first layer is either chemically stable or weakly chemically unstable, such having an instability energy of less than 10 meV/atom, while in contact with the material of the second layer according to the phase diagram for these two materials, i.e., the material of the first layer and the material of the second layer. The electron affinity of the material of the first layer may be less than an electron affinity of the material of the second layer in order to reduce the leakage of the first layer.

In some embodiments, the material of the first layer includes one of gallium arsenide or gallium aluminum arsenide. The material of the second layer includes titanium oxide. The first layer may further include a p-dopant. Some examples of the p-dopant include zinc, beryllium, and carbon. The concentration of the p-dopant in the material of the first layer may be between about $10^{20}$ cm$^{-3}$ and $10^{22}$ cm$^{-3}$. The thickness of the first layer may be between about 1 nanometer and 3 nanometers. The first layer may be operable as an electronic conductor to at least one other device in an integrated circuit that includes the capacitor stack.

In some embodiments, the capacitor stack also includes a third layer such that the first layer is disposed between the second layer and the third layer. The third layer may be operable as a negative outer electrode and as an electronic conductor to at least one other device in an integrated circuit that includes the capacitor stack. The third layer may include one of titanium nitride and aluminum.

In some embodiments, the capacitor stack also includes a fourth layer such that the second layer is disposed between the first layer and the fourth layer. The fourth layer directly interfaces the second layer and is operable as a positive inner electrode. The material of the fourth layer is chemically stable in contact with the material of the second layer according to the phase diagram of these two materials, i.e., the material of the second layer and the material of the fourth layer. The sum of the electron affinity and bandgap of the material of the fourth layer may be less than that of the second layer. In some embodiments, the material of the fourth layer comprises an n-dopant. The concentration of the n-dopant in the material of the fourth layer is between about $10^{20}$ cm$^3$ and $10^{22}$ cm$^{-3}$. In some embodiments, the material of the fourth layer includes zinc oxide doped with aluminum. In some embodiments, the material of the fourth layer also includes gallium arsenide or gallium aluminum arsenide.

In some embodiments, the capacitor stack may include a fifth layer such that the fourth layer is disposed between the second layer and the fifth layer. The fifth layer may be operable as a positive outer electrode and as an electronic conductor to at least one other device in an integrated circuit that includes the capacitor stack. The fifth layer may include one of titanium nitride and aluminum. Alternatively, the fifth layer may directly interface the second layer.

Also provided is a capacitor stack including a first layer operable as a negative inner electrode, a second layer operable as a dielectric layer, and a third layer operable as a positive inner electrode. The second layer is disposed between and directly interfaces the first layer and the third layer. The first layer includes a p-dopant and one of one of gallium arsenide or gallium aluminum arsenide. The concentration of the p-dopant in the first layer is between about $10^{20}$ cm$^{-3}$ and $10^{22}$ cm$^{-3}$. The second layer includes titanium oxide. The third layer includes an n-dopant and one of one of gallium arsenide, gallium aluminum arsenide, or zinc oxide. The concentration of the n-dopant the third layer is between about $10^{20}$ cm$^{-3}$ and $10^{22}$ cm$^{-3}$.

Also provided is a method of fabricating a capacitor stack. The method involves forming a first layer operable as a negative inner electrode and forming a second layer operable as a dielectric layer. The first layer directly interfaces the second layer. The material of the first layer is chemically stable in contact with the material of the second layer according to the phase diagram of these two materials, i.e., the material of the first layer and the material of the second layer. The electron affinity of the material of the first layer may be less than the electron affinity of the material of the second layer.

These and other embodiments are described further below with reference to the figures.

DETAILED DESCRIPTION

Figure 1A:
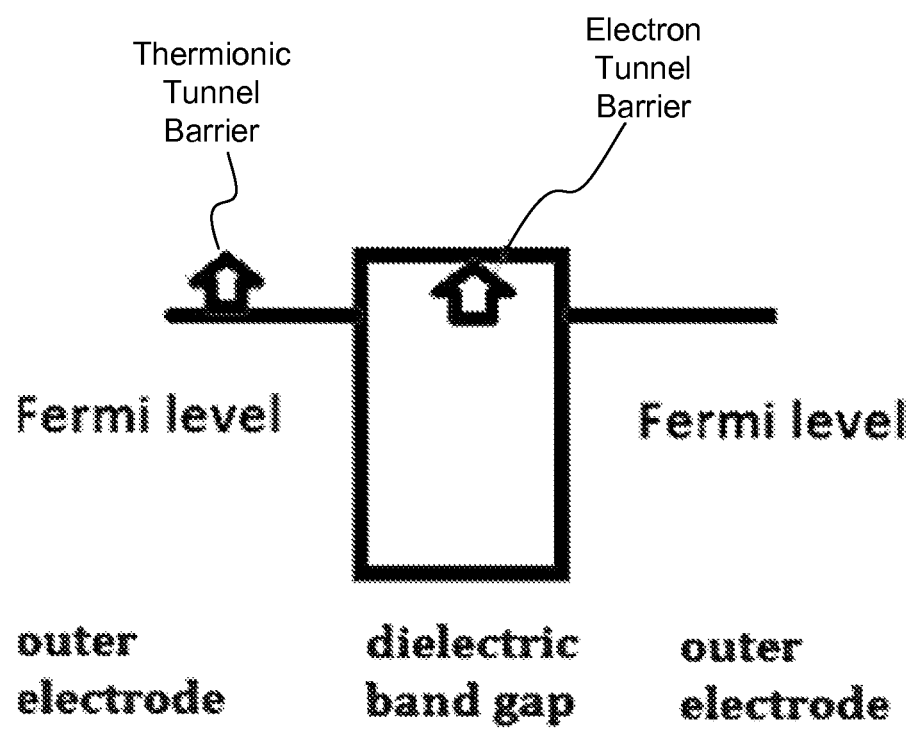
FIG. 1A is a schematic band diagram for a conventional capacitor stack.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

INTRODUCTION

DRAM and various other electronics applications may include capacitance components (i.e., capacitors). A typical capacitor includes two electrodes with a dielectric layer disposed between the two electrodes forming a stack. The dielectric layer generally determines the capacitance of this stack. Stacks with high capacitance may be desirable for some applications. Two fundamental ways to increase the capacitance include (1) increasing the dielectric constant of the dielectric layer (e.g., using high k materials) and (2) decreasing the thickness of the dielectric layer. However, a high dielectric constant correlates with a low value of the dielectric band gap and thus a low barrier height at the interface between the dielectric layer and electrode. The lower barrier height leads to increased leakage, which undesirable for many applications that, for example, require preservation of the charge for prolonged periods of time. Furthermore, the small thickness also increases leakage due to direct tunneling.

Electrodes fabricated with high work function materials, such as platinum, iridium, and the like, may help to alleviate these leakage problems by increasing the barrier height at the interface with the dielectric. However, most of the high work function materials are very expensive and/or difficult to deposit. Specifically, use of these materials has led to various deposition problems in a typical DRAM geometry.

Capacitor stacks described herein use high k dielectric materials (e.g., titanium oxide) for their dielectric layer while providing tunneling barriers at the interface with electrode by using specifically configured inner electrodes. Specifically, a capacitor stack described herein may include one or more inner electrode in addition two outer electrodes. It should be noted that the terms "inner" and "outer" are used for differentiating purposes only. As such, an outer electrode may be used without a corresponding inner electrode. The term "corresponding" is used herein to differentiate the positive side of the dielectric layer from the negative side. As further described below, the selection and presence of inner and outer electrodes on one side is generally independent from the selection and presence of inner and outer electrodes on the other side.

Each inner electrode, if present, directly interfaces the dielectric layers and is disposed in between the dielectric layers and the corresponding outer electrode. In general, the outer electrodes provide conductive contacts and the inner electrodes form a tunneling barrier for the dielectric layer(s). In some embodiments, the same component may combine functions of both inner and outer electrodes. In other words, an inner electrode may provide an effective tunneling barrier, and may also be sufficiently conductive to be operable as an outer electrode and as an electronic conductor to one or more other devices in the same integrated circuit. In general, a capacitor stack described herein includes at least one inner electrode in addition to a dielectric layer. This inner electrode may be disposed between an outer electrode and the dielectric layer or function as an outer electrode. The opposing side of this dielectric layer may directly interface another inner electrode or another outer electrode. If the other inner electrode is present, then it also may be disposed between another outer electrode and the dielectric layer or function as an outer electrode. These embodiments are further described below with reference to FIGS. 2A-2C.

The outer electrodes, if present, may be formed from a highly conductive material, such as a metal (e.g., Al), conductive nitrides (e.g., TiN), doped polysilicon, and other like materials. The resistivity of outer electrodes may be less than about $10^{-4}$ Ohm-cm or even less than about $5 \times 10^{-6}$ Ohm-cm. On the contrary, the resistivity of inner electrodes may be between about 100 Ohm-cm and $10^{-4}$ Ohm-cm or, more specifically, between about 10 Ohm-cm and $10^{-3}$ Ohm-cm, when the inner electrodes are not also operable as outer electrodes and as electronic conductors to other devices in integrated circuits. There are generally no restrictions on the thickness of the outer electrodes from the capacitor stack design perspective. In other words, the thickness will not influence the performance of the capacitor stack. However, the thickness of the inner electrodes may be between about 1 nanometer and 5 nanometers or, more specifically, between about 1 nanometer and 3 nanometers. The thickness of the inner electrodes should be sufficient to ensure conformal coverage despite any roughness variations. Furthermore, the thickness of the inner electrode may be sufficient to provide a substantial suppression of tunneling of charge carriers, such as thermionic charge carriers, in an energy range that corresponds to the band gap of the inner electrode. At the same time, the thickness should be kept to a minimum for scaling reasons. The composition of inner electrodes may vary depending on their polarity. For example, a negative inner electrode may be formed from a very heavily p-doped semiconductor. Specifically, the negative inner electrode may be formed from gallium arsenide (GaAs) or gallium aluminum arsenide (GaAlAs) doped with zinc (Zn), beryllium (Be), or carbon (C). The dopant concentration may between about $10^{20}$ cm$^{-3}$ and $10^{22}$ cm$^{-3}$. In some embodiments, the negative inner electrode may be formed from germanium (Ge). A positive inner electrode may be formed from a very heavily n-doped semiconductor. Specifically, the positive inner electrode may be formed from zinc oxide (ZnO) doped with aluminum (Al). The dopant concentration may also between about $10^{20}$ cm$^{-3}$ and $10^{22}$ cm$^{-3}$.

Both inner electrode materials are selected to be chemically stable in contact with the material of the dielectric layer according to the phase diagram and bulk thermodynamic data of the material of the inner electrodes and the material of the dielectric layer. In some embodiments, the chemical stability is such that thermodynamic instability is less than about 10 meV/atom for a given pair of materials. By way of example, silicon is not chemically stable in contact with most high-k materials and may produce layers of silicon oxide. The band gap of the materials for inner electrodes may be between about 0.5 eV and 4 eV, such as about 2 eV. Materials with these moderate bandgaps are likely to accept sufficient levels of doping, and are also likely to meet the band-alignment criteria for low leakage while the Fermi level is inside the bandgap of the dielectric layer. Furthermore, the dielectric constant of the materials for inner electrodes may be between about 5 and 300 or, more specifically, between 10 and 30. At the same time, the dielectric constant of the materials for dielectric layers may be at least about 40 or even at least about 60.

Performance characteristics of capacitor stacks described herein will now be described with reference to FIGS. 1A and 1B. Specifically, FIG. 1A is a schematic band diagram for a conventional capacitor stack. In this stack, the effective barriers for thermionic electron emission and electron tunneling are both determined by the difference between the electrode work function and the electron affinity of the dielectric (aside from the Schottky lowering and interfacial pinning and interfacial dipole layer effects). The same difference influences the contributions from the trap-assisted electron tunneling mechanism. The hole barriers are typically much higher, except for the highest work function (or lowest electron affinity) materials in the absence of strong pinning.

Figure 1B:
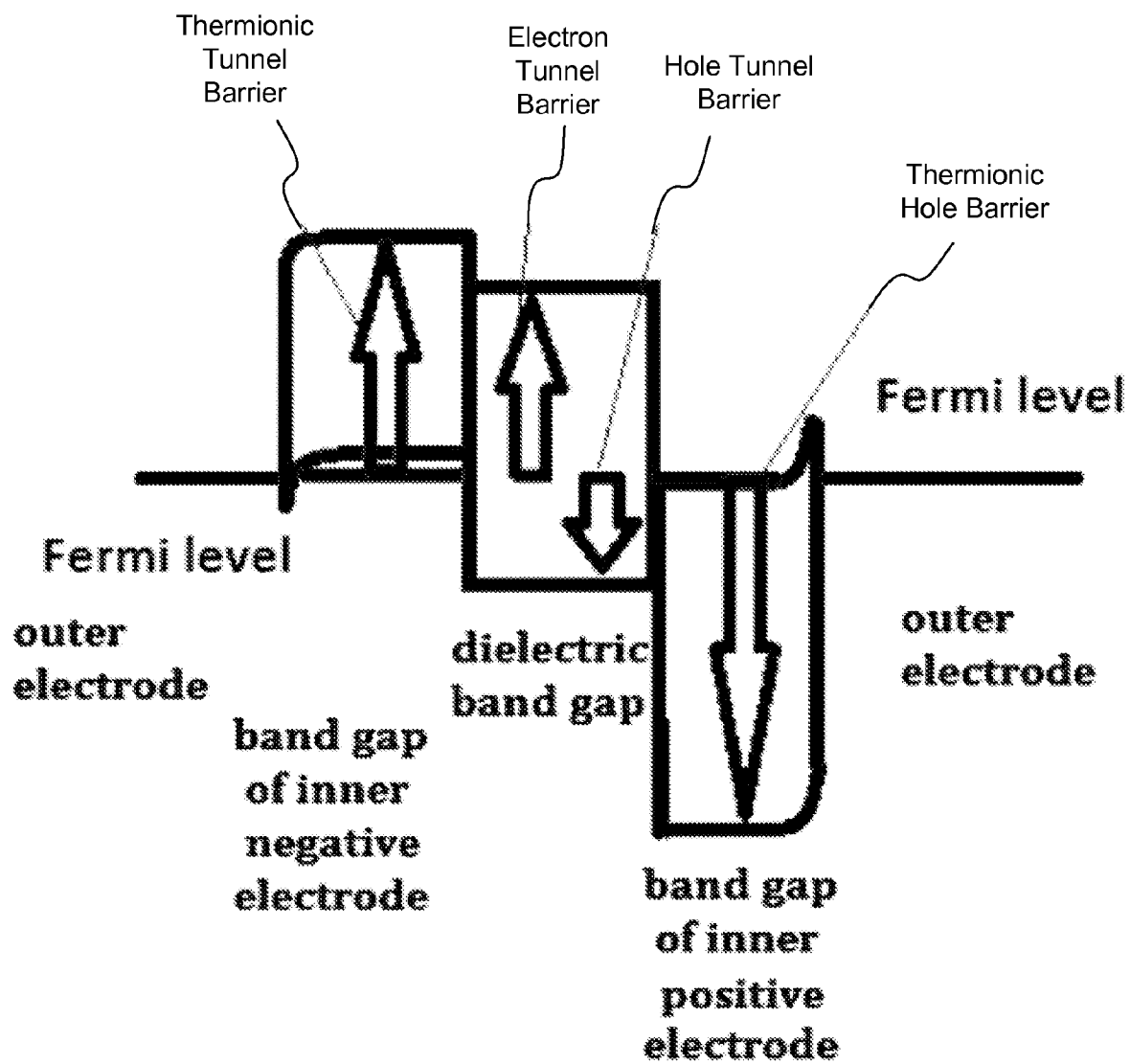
FIG. 1B is a schematic band diagram for a capacitor stack with two inner electrodes and two outer electrodes, in accordance with some embodiments.

FIG. 1B is a schematic band diagram for a capacitor stack with two inner electrodes and two outer electrodes, in accordance with some embodiments. In this stack the effective barriers for thermionic emission are given by the band gaps of the inner electrode materials. The effective barrier for the electron tunneling is still determined by the difference between the negative electrode work function and the electron affinity of the dielectric (plus the Schottky lowering and interfacial pinning and interfacial dipole layer effects). However, the effective work function of the material of the negative inner electrode (e.g., a heavily p-doped semiconductor) is higher than the work function of the materials of the outer electrode. For example, the work function of p-doped GaAs can be about 5.0 eV, while the work function of aluminum is 4.06 eV-4.26 eV, the work function of silver is 4.5 eV-4.7 eV, and the work function of titanium nitride is 4.5 eV-4.6 eV.

While, in general, using high work function materials for positive inner electrodes can lead to hole leakage, materials for positive inner electrodes described herein may be n-doped semiconductors. The hole leakage for these materials is blocked by a mechanism similar to the one described above for electrodes and illustrated in FIG. 1B. For clarity, FIG. 1B disregards slight disparity in the work functions of the two inner electrodes. For example, the p-doped ZnO may have a work function of ~4.6 eV. In some embodiments, the hole leakage of a capacitor stack is negligible. In some embodiments, only an outer electrode is used on the positive side and no inner electrode is provided.

Disparity of work functions at different electrodes may create built-in fields that would partially deplete the inner negative electrode and would decrease the effective tunneling barrier. The built-in fields can arise because the work function of the positive electrode may then be considerably lower than the work function of the negative inner electrode. This disparity should not be too large; therefore, it may be preferable to use an inner positive electrode layer even if the work function at the negative electrode is not sufficiently high to cause hole leakage.

In some embodiments, due to the high doping level of the inner electrodes, the capacitor stack can store a substantial charge without fully depleting its electrodes. For example, an inner electrode having a thickness of 1 nanometer and a doping level of $10^{21}$ cm$^{-3}$ can maintain a typical charge for DRAM applications without becoming fully depleted. Even if this inner electrode approaches its depletion regime, the relatively high dielectric constant and the relatively small thickness of the inner electrode will help to maintain the large capacitance. The high dielectric constant is a partial result of the small band gap. Specifically, the ionic dielectric constant is inversely proportional to roughly a square root of the dielectric constant. The electronic contribution is $1+(E_{plasma}/E_{gap})^2$.

As described above, the material of an inner electrode is chemically stable in contact with the material of the dielectric layer according to the phase diagram of these two materials. Furthermore, the material of an inner electrode may be stable when directly interfacing the material of an outer electrode. For example, doped silicon, while possessing many electrical characteristics presented above, may not be an advantageous inner electrode to use with a titanium oxide dielectric. The silicon would be likely to react with the titanium oxide to form $SiO_2$, $TiSi_2$, and/or TiSi, and the corresponding instability energy is likely to be much larger than 10 meV/atom; for the reaction 3 Si+$TiO_2$→$SiO_2$+$TiSi_2$, the instability energy may be 0.158 to 0.175 meV/atom. Doped silicon may be similarly unstable when interfacing zirconium oxide. On the other hand, GaAs and Ge are both stable when interfacing titanium oxide.

In some embodiments, the material of an inner electrode may be "weakly unstable;" not stable in the very strictest sense, yet stable enough for use in these devices, when in contact with the material of the dielectric layer. Specifically, the instability energy can be less than 10 meV/atom. For example, it has been found that zinc oxide does not have a strong thermodynamic driving force to react with titanium oxide. While it is thermodynamically preferable to form a $Ti_3Zn_2O_8$ compound, the energetic gain from this reaction (only around 4 meV/atom) is small compared to the epitaxial energy and kinetic barrier effects opposing the formation of this new phase from deposited titanium oxide and zirconium oxide layers. However, care should be taken to avoid the reaction between titanium oxide and zirconium oxide during the deposition stage before the zinc oxide has fully precipitated.

Some pairs of electrode/dielectric materials may be chemically stable, yet they may not possess other required characteristics for a capacitor with inner electrodes. For example, GaAs can be heavily p-doped and is chemically stable when interfacing zirconium oxide $ZrO_2$, however the electron affinity of GaAs is not sufficiently small compared to the electron affinity of $ZrO_2$.

It has been found that adding aluminum to gallium arsenide helps to lower the valence band minimum (VBM) and increase the work function of the resulting combination in comparison to gallium arsenide. However, aluminum arsenide can react with titanium oxide, e.g. via 18 AlAs+22 $Ti_2O \rightarrow 11$ $TiO_2$+6 $Ti_4As_3$+9 $TiAl_2$. As such, the amount of aluminum should be limited in gallium arsenide, if aluminum gallium arsenide is used for an inner electrode that directly interfaces a dielectric layer formed from titanium oxide. In some embodiments, the concentration of aluminum is less than 30% atomic or even less than 20% atomic in aluminum gallium arsenide used as an inner electrode.

Capacitor Stack Examples

Figure 2A:
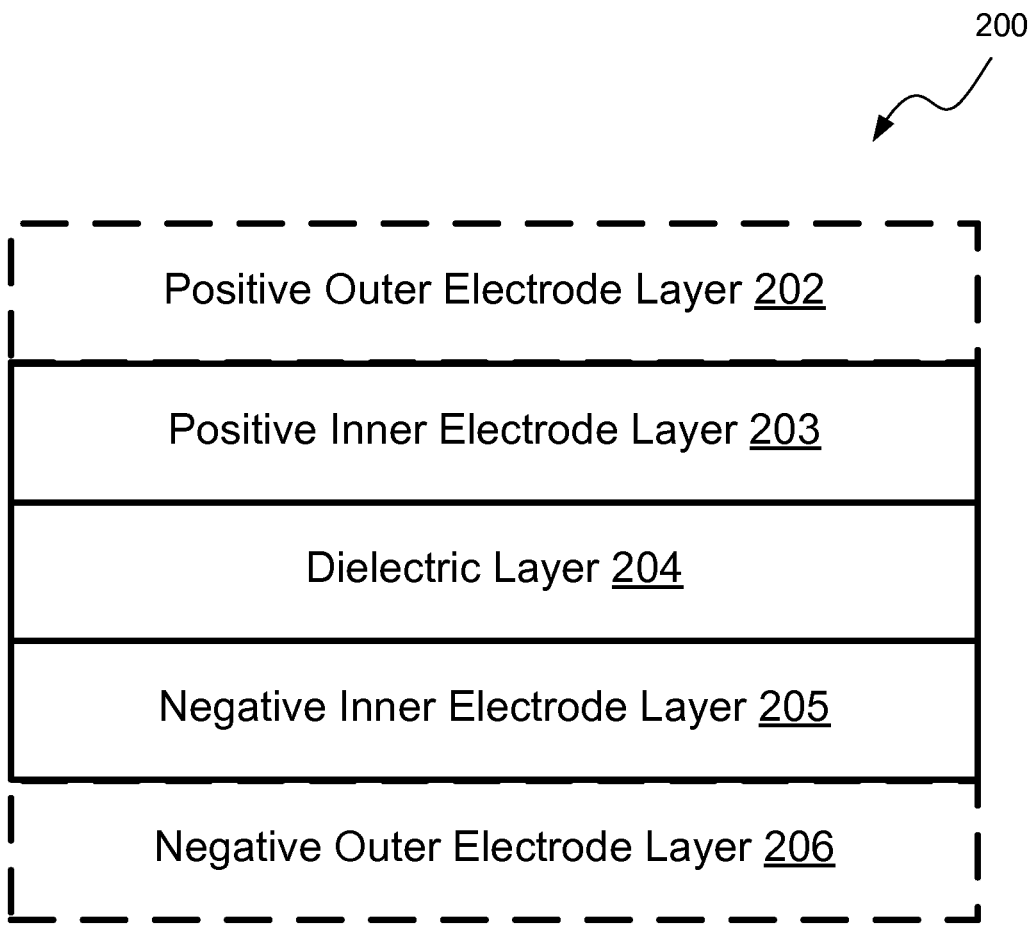
FIGS. 2A-2C are schematic representation of different capacitor stacks, in accordance with some embodiments.
Figure 2B:
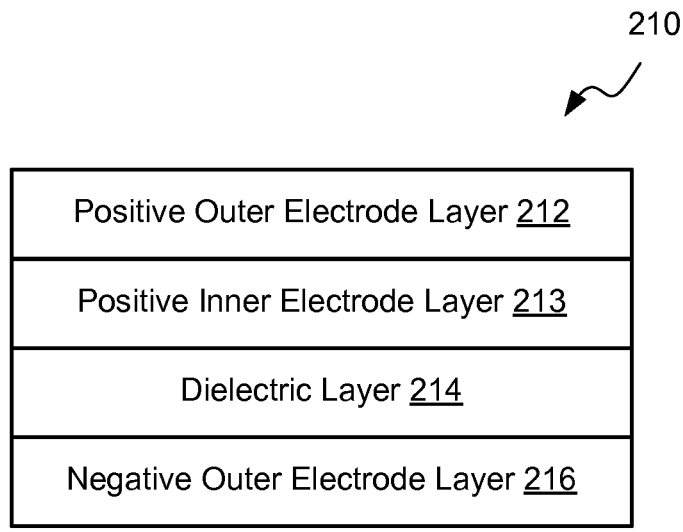
Figure 2C:
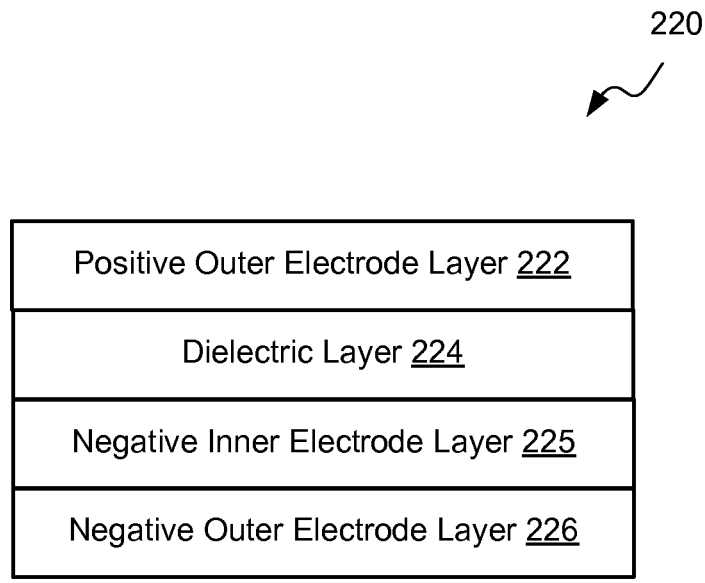

FIGS. 2A-2C are schematic representation of different capacitor stacks, in accordance with some embodiments. Specifically, FIG. 2A is a schematic representation of a capacitor stack 200 that includes a positive inner electrode layer 203, a negative inner electrode layer 205, and a dielectric layer 204 disposed in between positive inner electrode layer 203 and negative inner electrode layer 205. In some embodiments, one of positive inner electrode layer 203 or negative inner electrode layer 205 is not present. These embodiments are described below with reference to FIGS. 2B and 2C. Regardless of how may inner electrode layers are present, all present inner electrode layers directly interface with the dielectric layers for reasons describe above. Furthermore, the material of each present inner electrode layer is chemically stable in contact with the material of the dielectric layer according to the phase diagram for these two materials.

The electron affinity of the material of negative inner electrode layer 205 may be less than the electron affinity of the material of dielectric layer 204 in order to reduce the leakage of capacitor stack 200. In some embodiments, the material of negative inner electrode layer 205 includes one of gallium arsenide or gallium aluminum arsenide. In these embodiments, the material of dielectric layer 204 includes titanium oxide. Furthermore, negative inner electrode layer 205 may further include a p-dopant. Some examples of the p-dopant include zinc, beryllium, and carbon. The concentration of the p-dopant in the material of negative inner electrode layer 205 may be between about $10^{20}$ cm$^{-3}$ and $10^{22}$ cm$^{-3}$. The thickness of negative inner electrode layer 205 may be between about 1 nanometer and 3 nanometers.

A capacitor stack may also include one or two optional outer electrode layers. For example, FIG. 2A illustrates capacitor stack 200 having positive outer electrode layer 202 and negative outer electrode layer 206. When positive outer electrode layer 202 is present, positive inner electrode layer 203 is disposed between positive outer electrode layer 202 and dielectric layer 204. When a positive outer electrode layer is not present, a positive inner electrode layer may be operable as an electronic conductor to at least one other device in an integrated circuit that includes the capacitor stack. This other device may be a transistor as further described below with reference to FIG. 4.

When negative outer electrode layer 206 is present, negative inner electrode layer 205 is disposed between negative outer electrode layer 206 and dielectric layer 204. When a negative outer electrode layer is not present, a negative inner electrode layer may be operable as an electronic conductor to at least one other device in an integrated circuit that includes the capacitor stack. This other device may be a transistor as further described below with reference to FIG. 4. Otherwise, negative outer electrode layer 206 may be operable as an electronic conductor to at least one other device in an integrated circuit that includes the capacitor stack. Negative outer electrode layer 206 may include one of titanium nitride and aluminum. Likewise, positive outer electrode layer 202 may include one of titanium nitride and aluminum.

The materials of positive inner electrode layer 203 may include an n-dopant. The concentration of the n-dopant may be between about $10^{20}$ cm$^3$ and $10^{22}$ cm$^{-3}$. In some embodiments, the material of positive inner electrode layer 203 includes zinc oxide doped with aluminum. In some embodiments, the material of positive inner electrode layer 203 may be gallium arsenide or gallium aluminum arsenide.

FIGS. 2B and 2C illustrate capacitor stacks that have only one inner electrode layer. Specifically, FIG. 2B illustrates a capacitor stack 210 that includes positive outer electrode layer 212, positive inner electrode layer 213, dielectric layer 214, and negative outer electrode layer 216. Positive inner electrode layer 213 is disposed between positive outer electrode layer 212 and dielectric layer 214. However, there is no negative inner electrode layer in capacitor stack 210 and negative outer electrode layer 216 directly interfaces dielectric layer 214.

FIG. 2C illustrates a capacitor stack 220 that includes positive outer electrode layer 222, dielectric layer 224, negative inner electrode layer 225, and negative outer electrode layer 226. Negative inner electrode layer 225 is disposed between negative outer electrode layer 226 and dielectric layer 224. However, there is no positive inner electrode layer in capacitor stack 220 and negative outer electrode layer 216 directly interfaces dielectric layer 214.

In general, outer electrode layers may be from any conductive materials that provide sufficient electrical conductivity, such as metals, metal alloys, conductive metal oxides, conductive metal nitrides, and conductive metal silicides. Some examples of conductive metal oxides include molybdenum oxide, tungsten oxide, ruthenium oxide, iron oxide, iridium oxide, chromium oxide, manganese oxide, tin oxide, cobalt oxide, or nickel oxide. The materials for a dielectric layer may include non-conductive oxides and oxynitrides such as $SiO_2$, a bilayer of $SiO_2$ and $Si_xN_y$, SiON, $Al_2O_3$, $HfO_2$, $HfSiO_x$, $ZrO_2$, $Ta_2O_5$, $TiO_2$, $Nb_2O_5$, $SrTiO_3$ (STO), BaSrTiOx (BST), $PbZrTiO_x$ (PZT), or doped versions of the same. These dielectric materials may be formed as a single layer or may be formed as a hybrid or nanolaminate structure. A specific example of a dielectric material is titanium oxide or, more specifically, doped titanium oxide. For example, aluminum may be used to dope titanium oxide to further reduce the leakage current. Other dopants for the dielectric material include Ga, Sr, Y, La, Zr, Hf, Sc, Nd, Ce, In, Sn, Er, Gd, Mg, Mn, Lu, Pr, Co, S, Se, Te, C, F, Cl, Br, I, P, As, Sb, or Bi.

Capacitor Stack Fabrication Examples

Figure 3:
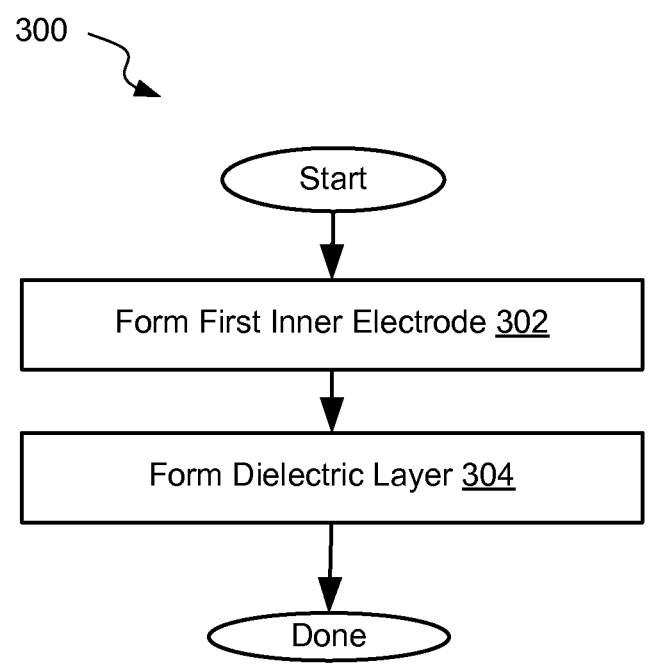
FIG. 3 is a process flowchart corresponding to a method of fabricating a capacitor stack, in accordance with some embodiments.

FIG. 3 is a process flowchart corresponding to a method 300 of fabricating a capacitor stack, in accordance with some embodiments. Method 300 involves forming an inner electrode during operation 302. The inner electrode may be formed using atomic layer deposition (ALD), chemical vapor deposition (CVD), or other suitable deposition technique. For example, the inner electrode may include aluminum gallium arsenide. Examples of arsenic containing precursors include triphenyl arsine ($(C_6H_5)_3As$) and triphenyl arsine oxide ($(C_6H_5)_3AsO$). Examples of aluminum containing precursors include aluminum tris(2,2,6,6-tetramethyl 3,5-heptanedionate) ($Al(OCC(CH_3)_3CHCOC(CH_3)_3)_3$), triisobutyl aluminum ($[(CH_3)_2CHCH_2]3Al$), trimethyl aluminum ($(CH_3)_3Al$), and tris(dimethylamido)aluminum ($Al(N(CH_3)2)_3$). Examples of gallium containing precursors include triethyl gallium ($(CH_3CH_2)_3Ga$), trimethyl gallium ($Ga(CH_3)_3$), and tris(dimethylamido) gallium ($C_{12}H_{36}Ga_2N_6$). When ALD is used to form the inner electrode including aluminum gallium arsenide, the inner electrode may be deposited as a nanolaminate of gallium arsenide layers and aluminum arsenide layers and then annealed to redistribute materials within the electrode.

Method 300 also involves forming a dielectric layer during operation 304. Operation 304 may be performed before or after operation 302. Regardless of the order, the dielectric layer formed during operation 304 directly interfaces the inner electrode formed during operation 302. Furthermore, the material of the inner electrode is chemically stable in contact with the material of the dielectric layer according to the phase diagram of these two materials. Various examples of material combinations are described above with reference to FIGS. 2A-2C.

Application Examples

Examples of applications for capacitor stacks include DRAM devices. DRAM memory cells effectively use a capacitor to store charge for a period of time, with the charge being electronically "read" to determine whether a logical "one" or "zero" has been stored in the associated cell. A cell transistor may be used to access the cell. The cell transistor is turned "on" in order to store data on each associated capacitor and is otherwise turned "off" to isolate the capacitor and preserve its charge. More complex DRAM cell structures exist, but this basic DRAM structure will be used for illustrating the application of this disclosure to DRAM devices.

Figure 4:
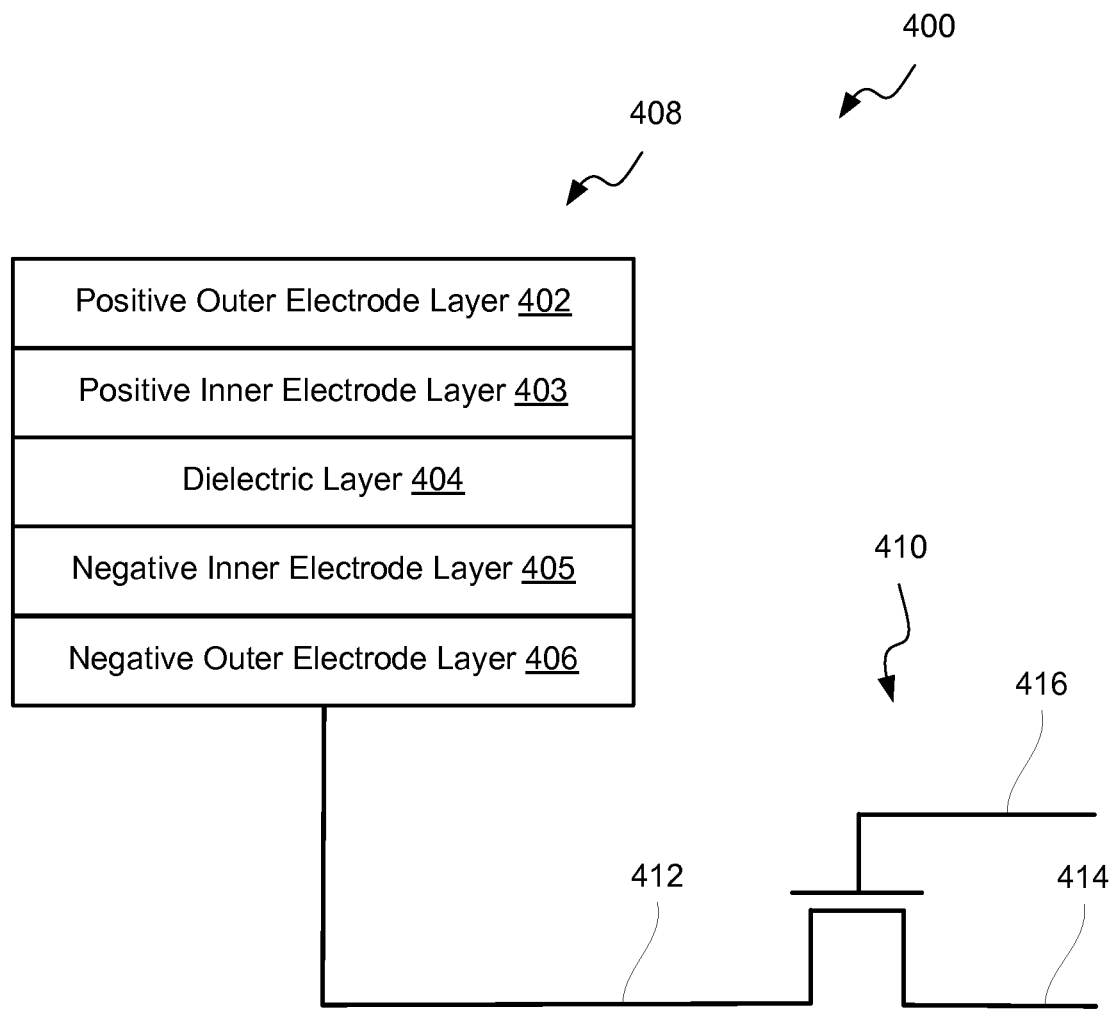
FIG. 4 is a schematic illustration of a DRAM cell including a capacitor stack, in accordance with some embodiments.

FIG. 4 is a schematic illustration of a DRAM device 400 including a capacitor stack 408 and a transistor 410. DRAM device 400 may be also referred to as a DRAM cell, while capacitor stack 408 may be also referred to a cell capacitor, and transistor 410 may be referred to as a cell transistor. Transistor 410 may be a MOS transistor having a gate 416, source 412, and drain 414. Gate 416 is usually connected to a word line. One of source 412 or drain 414 may be connected to a bit line. Capacitor stack 408 includes positive outer electrode layer 402, positive inner electrode layer 403, dielectric layer 404, negative inner electrode layer 405, and negative outer electrode layer 406. These components may be arranged as shown in FIG. 4. Further description of these components and various other examples of capacitor stacks are presented above and described with reference to FIGS. 2A-2C. Regardless of these variations, one of the electrodes of a capacitor stack is connected to either source or drain of the transistor. As shown in FIG. 4, negative outer electrode layer 406 is connected to source 412. In the context of DRAM device 400, negative outer electrode layer 406 may be also referred to as a storage electrode, while positive outer electrode layer 402 may be referred to as a plate electrode. Positive outer electrode layer 402 may be connected to a reference potential conductor. When DRAM device 400 is selected, transistor 410 may be turned "on" by an active level of the word line to read or write data from or into capacitor stack 408 via the bit line.

CONCLUSION

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. A capacitor stack comprising:
   a first layer operable as a negative inner electrode; and
   a second layer operable as a dielectric layer,
   a fourth layer, wherein the second layer is disposed between the first layer and the fourth layer, wherein the fourth layer directly interfaces the second layer and is operable as a positive inner electrode;
   wherein the first layer directly interfaces the second layer,
   wherein a material of the first layer has an instability energy of less than 10 meV/atom while in contact with a material of the second layer, and
   wherein an electron affinity of the material of the first layer is less than an electron affinity of the material of the second layer;
   wherein the material of the first layer comprises one of gallium arsenide and gallium aluminum arsenide;
   wherein the material of the second layer comprises titanium oxide;
   wherein the material of the first layer further comprises a p-dopant;
   wherein a concentration of the p-dopant in the material of the first layer is between about $10^{20}$ cm$^{-3}$ and $10^{22}$ cm$^{-3}$;
   wherein a material of the fourth layer has an instability energy of less than 10 meV/atom while in contact with a material of the second layer, and wherein a sum of an electron affinity and a bandgap of the material of the fourth layer is less than a sum of an electron affinity and a bandgap of the material of the second layer;
   wherein the material of the fourth layer further comprises one of gallium arsenide and gallium aluminum arsenide;
   wherein the material of the fourth layer comprises an n-dopant; and
   wherein a concentration of the n-dopant in the material of the fourth layer is between about $10^{20}$ cm$^{-3}$ and $10^{22}$ cm$^{-3}$.

2. The capacitor stack of claim 1, wherein the p-dopant of the material of the first layer comprises one of zinc, beryllium, or carbon.

3. The capacitor stack of claim 1, wherein a thickness of the first layer is between about 1 nanometer and 3 nanometers.

4. The capacitor stack of claim 1, wherein the first layer is operable as an electronic conductor to at least one other device in an integrated circuit comprising the capacitor stack.

5. The capacitor stack of claim 1, further comprising a third layer such that the first layer is disposed between the second layer and the third layer, the third layer being operable as a negative outer electrode and as an electronic conductor to at least one other device in an integrated circuit comprising the capacitor stack.

6. The capacitor stack of claim 5, wherein the third layer comprises one of titanium nitride or aluminum.

7. The capacitor stack of claim 1, further comprising a fifth layer such that the fourth layer is disposed between the second layer and the fifth layer, the fifth layer being operable as a positive outer electrode and as an electronic conductor to at least one other device in an integrated circuit comprising the capacitor stack.

8. The capacitor stack of claim 7, wherein the fifth layer comprises one of titanium nitride and aluminum.

9. The capacitor stack of claim 1, further comprising a fifth layer, wherein the second layer is disposed between the first layer and the fifth layer, wherein the fifth layer directly interfaces the second layer and is operable as a positive outer electrode and as an electronic conductor to at least one other device in an integrated circuit comprising the capacitor stack.

10. A capacitor stack comprising:
a first layer operable as a negative inner electrode;
a second layer operable as a dielectric layer; and
a third layer operable as a positive inner electrode,
wherein the second layer is disposed between and directly interfaces the first layer and the third layer,
wherein the first layer comprises a p-dopant and one of gallium arsenide and gallium aluminum arsenide,
wherein a concentration of the p-dopant in the first layer is between about $10^{20}$ cm$^{-3}$ and $10^{22}$ cm$^{-3}$,
wherein the second layer comprises titanium oxide, and
wherein the third layer comprises an n-dopant and one of gallium arsenide and gallium aluminum arsenide,
wherein a concentration of the n-dopant the third layer is between about $10^{20}$ cm$^{-3}$ and $10^{22}$ cm$^{-3}$.

* * * * *